(12) United States Patent
Farkas et al.

(10) Patent No.: US 12,495,483 B2
(45) Date of Patent: Dec. 9, 2025

(54) NOISE CANCELLATION IN LOW-SPEED SIGNALS

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 203 days.

(21) Appl. No.: 18/344,505

(22) Filed: Jun. 29, 2023

(65) Prior Publication Data

US 2025/0008638 A1   Jan. 2, 2025

(51) Int. Cl.
  *H05K 1/18*   (2006.01)
  *H05K 1/02*   (2006.01)
  *H05K 3/30*   (2006.01)

(52) U.S. Cl.
  CPC ........... *H05K 1/0216* (2013.01); *H05K 1/181* (2013.01); *H05K 3/30* (2013.01)

(58) Field of Classification Search
  CPC .................................................... H05K 1/0216
  USPC .......................................................... 361/760
  See application file for complete search history.

(56) References Cited

U.S. PATENT DOCUMENTS

| | | | |
|---|---|---|---|
| 8,392,181 B2 | 3/2013 | Archibald et al. | |
| 10,476,608 B2 | 11/2019 | Haube et al. | |
| 2012/0147979 A1* | 6/2012 | Best | G06F 13/4072 375/259 |
| 2016/0133690 A1* | 5/2016 | West | H10D 1/68 257/534 |
| 2020/0083835 A1* | 3/2020 | Kobayashi | H02M 5/4585 |

* cited by examiner

*Primary Examiner* — Stanley Tso
(74) *Attorney, Agent, or Firm* — Larson Newman, LLP

(57) ABSTRACT

An information handling system includes a PCB, a transmitter for a data communication interface, a receiver for the data communication interface, a first channel instantiated in the printed circuit board, and a second channel instantiated in the printed circuit board. The receiver includes a first input and a second input. The first channel is coupled between an output of the transmitter and the first input of the receiver and is routed in a first path in the printed circuit board. The second channel is coupled to provide a reference voltage to the second input of the receiver and is routed in a second path in the printed circuit board. At least a portion of the second path is routed adjacent to a portion of the first path.

17 Claims, 3 Drawing Sheets

NOISE CANCELLATION IN LOW-SPEED SIGNALS

FIELD OF THE DISCLOSURE

This disclosure generally relates to information handling systems, and more particularly relates to noise cancellation in low-speed signals.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a PCB, a transmitter for a data communication interface, a receiver for the data communication interface, a first channel instantiated in the printed circuit board, and a second channel instantiated in the printed circuit board. The receiver may include a first input and a second input. The first channel may be coupled between an output of the transmitter and the first input of the receiver and may be routed in a first path in the printed circuit board. The second channel may be coupled to provide a reference voltage to the second input of the receiver and may be routed in a second path in the printed circuit board. At least a portion of the second path may be routed adjacent to a portion of the first path.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
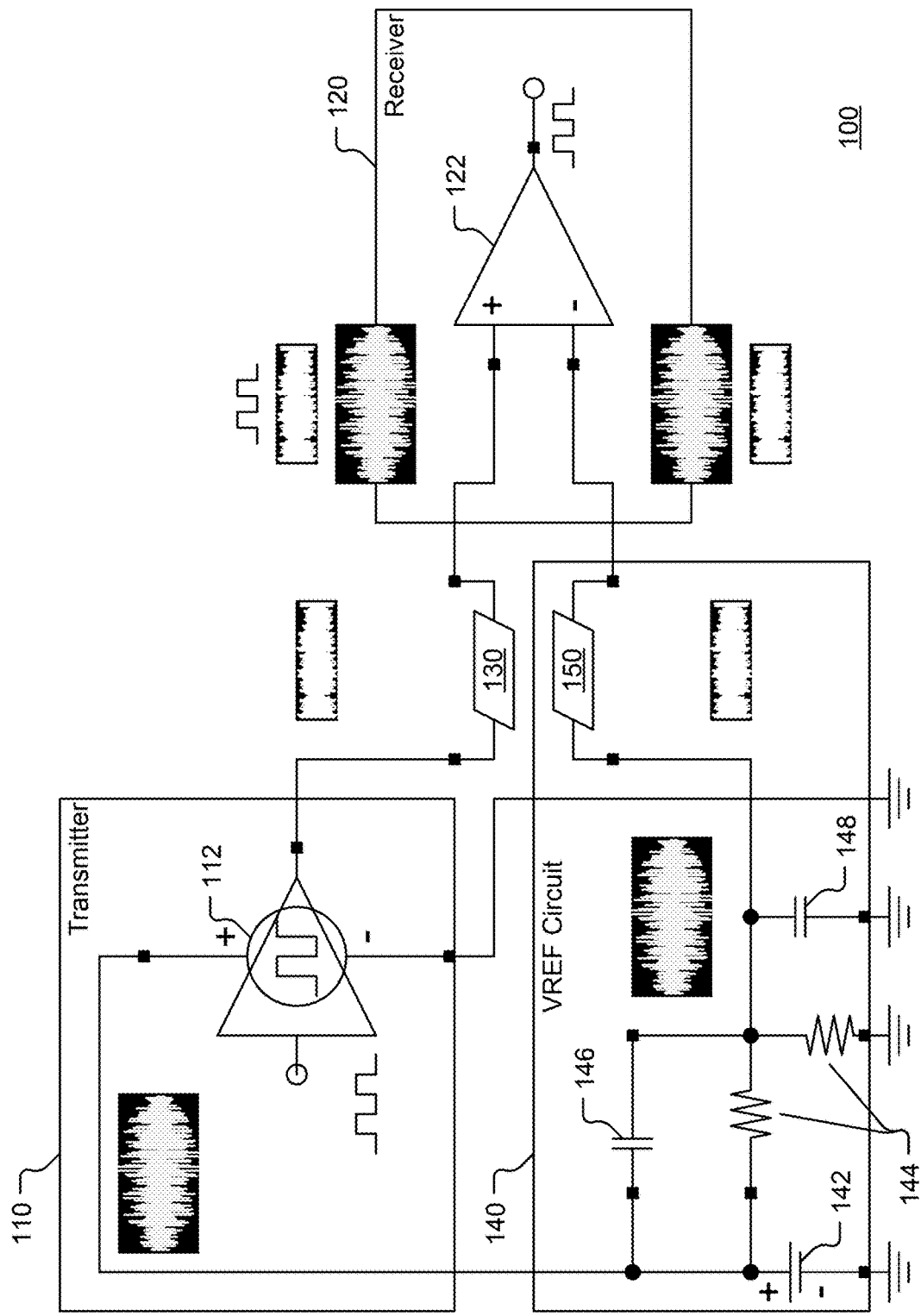
FIG. 1 is a block diagram illustrating an information handling system according to an embodiment of the current disclosure.

FIG. 1 illustrates an information handling system 100 that includes one or more low-speed data communication interfaces for providing various functions and features of the information handling system that do not need the data bandwidth typically associated with other high-speed data communication interfaces of the information handling system. For example, various management tasks within information handling system 100, such as the monitoring, management, and maintenance of the elements of the information handling system, the servicing of human interface devices (HIDs), or other tasks may be adequately serviced by low-speed data communication interfaces. While not a precise definition, low-speed data communication interfaces are typically understood to be data communication interfaces that operate at data bandwidths around 10 megabits per second (Mbs) or lower. Examples of low-speed data communication interfaces include an inter-integrated circuit (I2C) or improved inter-integrated circuit (I3C) interfaces, low pin count (LPC) interfaces, system management bus (SMB) or power management bus (PMB) interfaces, serial peripheral interface (SPI) interfaces, proprietary low-speed data communication interfaces, or other interfaces as needed or desired.

Information handling system 100 includes a low-speed data communication interface transmitter 110 connected to a low-speed data communication interface receiver 120 by a signal channel 130, and a voltage reference generator 140. Transmitter 110 includes an output buffer 112 that receives data and provides the data on an output to signal channel 130. Output buffer 112 is connected to a power plane provided by a power supply 142, described further below, and to a ground plane of the information handling system. Receiver 120 includes a receiver buffer 122 that receives the data from signal channel 130.

Voltage reference generator 140 includes a power supply 142, a reference generator network 144, a high-side capacitor 146, a low-side capacitor 148, and a reference channel 150. A first terminal of power supply 142 provides a ground plane of information handling system 100, and a second terminal of the power supply provides a positive voltage node that is connected to a power input of transmit buffer 112. Reference generator network 144 is connected between the ground plane and the voltage node, and provides a reference voltage to a reference voltage input of receive buffer 122 via reference channel 150. Reference generator network 144 is illustrated as a voltage divider circuit with a first terminal of a first resistor connected to the voltage node, where a second terminal of the first resistor provides a reference voltage node. A first terminal of the second resistor is connected to the reference node, and a second terminal of the second resistor is connected to the ground plane. In this way, reference generator network. 144 provides a fixed reference voltage level at the reference voltage node. While shown and described as a voltage divider, a reference generator network similar to reference generator network 144 may be provided by other circuit topologies, as needed or desired.

A reference voltage may typically be provided for receivers, particularly where the receivers are configured as single-ended signaling receivers, and such reference voltages may be provided by one or more reference generator network located proximate to the receivers, for example, by providing a pair of resistors to form a voltage divider in the proximity of the receiver integrated circuit. In such cases, the signal input to the receiver is typically provided on a summing input to the receiver, and the reference voltage is typically provided to a differential input to the receiver. As such, the receiver will typically be understood to represent a difference amplifier. This typical topology is advantageous in that power supply noise introduced into the transmitted signal from the transmit buffer is likewise introduced into the reference voltage node, and, because the reference voltage node is connected to the differential input to the receive buffer, the power supply noise will tend to be subtracted from the data signal, thereby cleaning up the data signal.

It has been understood by the inventors of the current disclosure that noise that is induced into the circuit traces on a printed circuit board (PCB) that carry the low-speed data communication signals, referred to as common mode noise, is not similarly compensated in the typical topology described above. In particular, it has been understood that low-speed data communication interfaces are typically designed and routed late in a PCB design process because high-speed data communication interfaces typically have much tighter tolerances, and much greater susceptibility to common mode noise. As such, the high-speed data communication interfaces are designed and routed through the areas of the PCB that experience the least noisy environment, leaving the low-speed data communication interfaces to be routed in more noisy areas of the PCB. Therefore, common mode noise is becoming a greater issue to the signal integrity of low-speed data communication interfaces.

In a particular embodiment, voltage reference generator 140, and particularly reference generator network 144 is located more proximate to transmitter 100, and reference channel 150 is routed on the PCB of information handling system 100 in a path that ensures that the circuit traces of the reference channel and of signal channel 130 are tightly coupled to each other. For example, signal channel 130 and reference channel 150 can be fabricated on the PCB by circuit traces that are separated by a small distance, that undergo similar metal layer transitions with closely separated through hole vias, or other physical structures within the PCB. Where several low-speed data communication interfaces are designed in accordance with a particular routing guideline for designing signal channels, the guideline prescribing signal trace separation, metal layer transitions, via placement, reference ground placement, or the like, a reference channel would be designed in accordance with the same routing guidelines, or perhaps even with tighter guidelines, as needed or desired. In this way, the common mode noise injected into signal channel 130 will similarly be experienced by reference channel 150. The benefit of increased noise immunity experienced in receive buffer 122 to power supply noise likewise accrues to the receiver buffer in increased immunity to common mode noise.

In a particular embodiment, signal channel 130 and reference channel 150 are routed such that the circuit elements within the PCB trace similar paths. For example, signal channel 150 may trace a path with a microstrip trace on a surface of the PCB to connect the signal channel to an integrated circuit device that includes transmitter 110, one or more additional microstrip traces or strip line traces in metal layers within the PCB and through-hole vias connecting the microstrip traces and strip line traces, and a final microstrip trace to connect the signal channel to an integrated circuit device that includes receiver 120. In this case, reference channel 150 will be understood to trace a path with common microstrip traces, strip line traces and through-hole vias, with the elements of the reference channel being positioned as nearly proximate to the similar elements of signal channel 130 as possible within the design rules of the PCB, the data communication interface, or the like. In another embodiment, signal channel 130 and reference channel 150 are routed such that the reference channel is routed with the elements tracing similar paths to only a portion of the elements of signal channel 130. For example, signal channel 130 may be routed for a portion of its circuit path in a particular area of the PCB that is understood to be highly noisy In this case, reference channel 150 may be routed similarly to signal channel 130 only for that portion of the signal channel that is subject to the higher noise.

FIG. 1 illustrates this graphically. In particular, large power noise is shown on the positive voltage node, the induced power noise is shown in the summing input of receiver 122, and, due to transmit buffer 112 and the voltage reference node being powered from power supply 142, the power noise is likewise shown in the differential input to the receiver. Thus the power noise is cancelled by the difference amplifier topology of receive buffer 122. Likewise, a smaller common mode noise is shown as being induced into signal channel 130 to appear on the summing input of receive buffer 122, and the common mode noise is also shown as being induced into reference channel 150 to appear on the differential input of to the receive buffer, and the common mode noise is cancelled by the difference amplifier topology of the receive buffer.

In a particular embodiment, signal channel 130 is configured to be terminated in receive buffer 122 in accordance with a specification associated with the particular type of low-speed data communication interface. Reference channel 150 may terminated similarly to signal channel 130, as needed or desired. Capacitor 146 is connected between the positive voltage node and the reference node to increase the coupling of the supply side power noise to the reference node, and capacitor 148 is connected between the ground plane and the reference node. In particular, capacitors 146 and 148 form a voltage divider for the AC noise, and reference channel 150 is thereby driven by the correct DC reference voltage and the proper amount of noise to match the noise on signal channel 130 so as to be perfectly cancelled at receive buffer 122.

Figure 2:
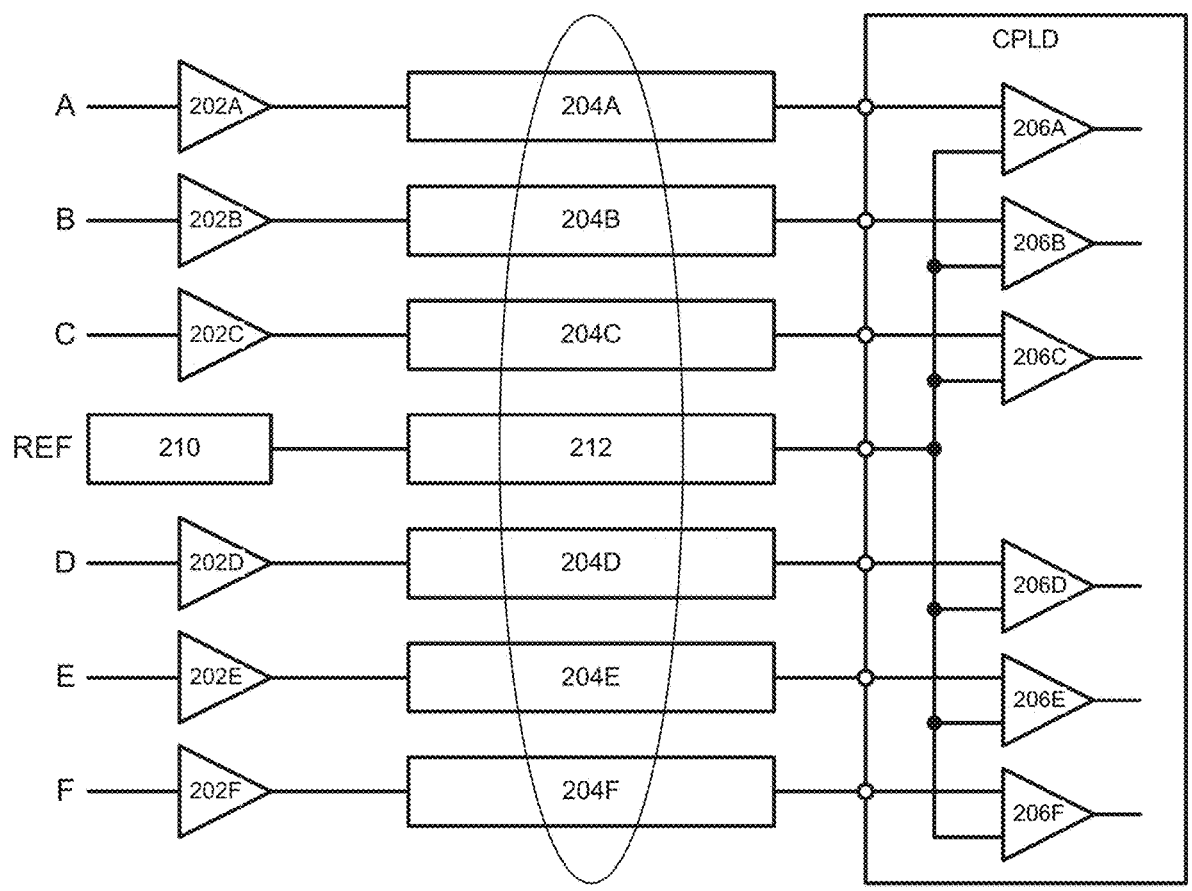
FIG. 2 is block a diagram of an information handling system according to another embodiment of the current disclosure.

FIG. 2 illustrates an information handling system 200 including six (6) low-speed data communication interfaces (A-F), and a reference voltage channel (REF). Each low-speed data communication interface includes a transmit buffer 202 connected to a receive buffer 206 via an associated signal channel 204. Each signal channel 204 is connected to a signal input of the associated receive buffer 206.

Low-speed data communication channels (A-F), and particularly their associated signal channels 204 are all closely spaced and routed similarly to each other within the PCB of information handling system 100, such that each signal channel is susceptible to the same induced common mode noise.

The reference voltage channel includes a voltage reference generator 210 similar to voltage reference generator 140, and a reference channel 212 similar to reference channel 150. Reference channel 212 is closely spaced to signal channels 204, such that the reference channel is susceptible to the same induced common noise as the signal channels. The reference voltage inputs to each receive buffer is connected to the output of reference channel 212. In this way, multiple high-speed data communication interfaces gain both power supply noise immunity and common mode noise immunity as described above.

Figure 3:
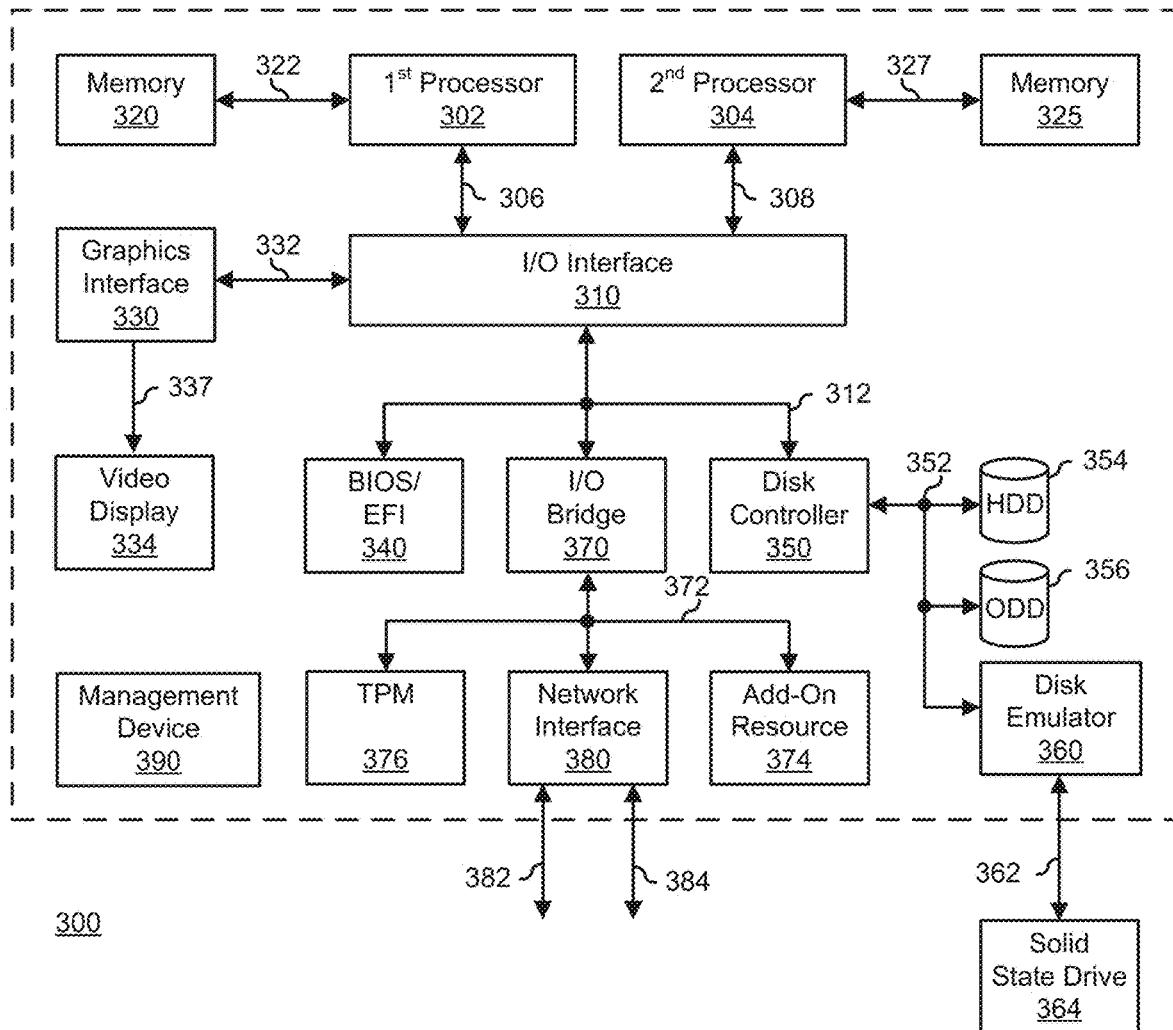
FIG. 3 is a block diagram illustrating a generalized information handling system according to another embodiment of the present disclosure.

FIG. 3 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 362, an I/O bridge 370, one or more add-on resources 374, a trusted platform module (TPM) 376, a network interface 380, a management device 390, and a power supply 395. Processors 302 and 304, I/O interface 310, memory 320, graphics interface 330, BIOS/UEFI module 340, disk controller 350, HDD 354, ODD 356, disk emulator 360, SSD 362, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 336 to a video display 334. In a particular embodiment, information handling system 300 includes separate memories that are dedicated to each of processors 302 and 304 via separate memory interfaces. An example of memories 320 and 330 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
    a printed circuit board;
    a transmitter for a single-ended data communication interface;
    a receiver for the single-ended data communication interface, wherein the receiver includes a first input and a second input;
    a first channel instantiated in the printed circuit board, the first channel being coupled between an output of the transmitter and the first input of the receiver, the first channel being routed in a first path in the printed circuit board;
    a second channel instantiated in the printed circuit board, the second channel being coupled to provide a reference voltage to the second input of the receiver, the second channel being routed in a second path in the printed circuit board, wherein at least a portion of the second path is routed adjacent to a portion of the first path, wherein the reference voltage is a different voltage level than a ground plane of the printed circuit board;
    a reference voltage network configured to provide the reference voltage; and
    a power supply configured to provide power to the transmitter and to the reference voltage network, wherein noise on the power supply is cancelled in the receiver.

2. The information handling system of claim 1, wherein a design rule for the printed circuit board provides a minimum distance between channels instantiated on the printed circuit board, and wherein the portion of the second path is further routed at the minimum distance from the portion of the first path.

3. The information handling system of claim 2, wherein in being routed at the minimum distance from the portion of the first path, a noise signal induced into the first path is also induced into the second path.

4. The information handling system of claim 3, wherein the receiver includes a difference amplifier with the first input being a summing input and with the second input being a difference input.

5. The information handling system of claim 4, wherein the noise signal induced into the first path is cancelled by the noise induced into the second path by the difference amplifier.

6. The information handling system of claim 5, wherein the noise signal includes common mode noise and power supply noise.

7. The information handling system of claim 1, wherein the reference voltage network includes a voltage divider.

8. The information handling system of claim 1, wherein the reference voltage network further includes a first capacitor coupled between a positive voltage node of the power supply and a reference voltage node of the voltage divider, and a second capacitor coupled between a ground plane of the power supply and the reference voltage node.

9. A method, comprising:
providing, on a printed circuit board (PCB), a transmitter for a single-ended data communication interface;
providing, on the PCB, a receiver for the single-ended data communication interface, wherein the receiver includes a first input and a second input;
instantiating, in the PCB, a first channel coupled between an output of the transmitter and the first input of the receiver, the first channel being routed in a first path in the printed circuit board;
instantiating, in the PCB, a second channel coupled to provide a reference voltage to the second input of the receiver, the second channel being routed in a second path in the printed circuit board, wherein at least a portion of the second path is routed adjacent to a portion of the first path, wherein the reference voltage is a different voltage level than a ground plane of the printed circuit board;
providing, on the PCB, a reference voltage network configured to provide the reference voltage; and
providing, on the PCB, a power supply configured to provide power to the transmitter and to the reference voltage network, wherein noise on the power supply is cancelled in the receiver.

10. The method of claim 9, wherein a design rule for the printed circuit board provides a minimum distance between channels instantiated on the printed circuit board, and wherein the portion of the second path is further routed at the minimum distance from the portion of the first path.

11. The method of claim 10, wherein in being routed at the minimum distance from the portion of the first path, a noise signal induced into the first path is also induced into the second path.

12. The method of claim 11, wherein the receiver includes a difference amplifier with the first input being a summing input and with the second input being a difference input.

13. The method of claim 12, wherein the noise signal induced into the first path is cancelled by the noise induced into the second path by the difference amplifier.

14. The method of claim 13, wherein the noise signal includes common mode noise and power supply noise.

15. The method of claim 9, wherein the reference voltage network includes a voltage divider.

16. The method of claim 9, wherein the reference voltage network further includes a first capacitor coupled between a positive voltage node of the power supply and a reference voltage node of the voltage divider, and a second capacitor coupled between a ground plane of the power supply and the reference voltage node.

17. An information handling system, comprising:
a printed circuit board;
a transmitter for a single-ended data communication interface;
a receiver for the single-ended data communication interface, wherein the receiver includes a first input and a second input;
a first channel instantiated in the printed circuit board, the first channel being coupled between an output of the transmitter and the first input of the receiver, the first channel being routed in a first path in the printed circuit board;
a second channel instantiated in the printed circuit board, the second channel being coupled to provide a reference voltage to the second input of the receiver, the second channel being routed in a second path in the printed circuit board, wherein the second path is routed adjacent to the first path, wherein the reference voltage is a different voltage level than a ground plane of the printed circuit board;
a reference voltage network configured to provide the reference voltage; and
a power supply configured to provide power to the transmitter and to the reference voltage network, wherein noise on the power supply is cancelled in the receiver.

* * * * *